United States Patent
Xia et al.

(10) Patent No.: US 7,172,969 B2
(45) Date of Patent: Feb. 6, 2007

(54) METHOD AND SYSTEM FOR ETCHING A FILM STACK

(75) Inventors: Annie Xia, Lynnfield, MA (US); Hiromasa Mochiki, Kofu (JP); Arpan P Mahorowala, Bronxville, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/926,403

(22) Filed: Aug. 26, 2004

(65) Prior Publication Data
US 2006/0051964 A1   Mar. 9, 2006

(51) Int. Cl.
*H01L 21/302* (2006.01)

(52) U.S. Cl. .................. 438/689; 438/23; 438/197; 438/283; 438/618; 438/706; 438/736; 427/573; 430/270.1; 430/313

(58) Field of Classification Search .................. 438/684
See application file for complete search history.

(56) References Cited

U.S. PATENT DOCUMENTS

| | | | |
|---|---|---|---|
| 4,465,552 A * | 8/1984 | Bobbio et al. ............... | 438/722 |
| 5,362,526 A * | 11/1994 | Wang et al. ................ | 427/573 |
| 5,811,022 A * | 9/1998 | Savas et al. ................... | 216/68 |
| 5,888,337 A | 3/1999 | Saito | |
| 6,283,131 B1 | 9/2001 | Chen et al. | |
| 6,316,167 B1 | 11/2001 | Angelopoulos et al. | |
| 6,365,466 B1 * | 4/2002 | Krivokapic ................. | 438/283 |
| 6,372,651 B1 * | 4/2002 | Yang et al. ................. | 438/706 |
| 6,482,726 B1 | 11/2002 | Aminpur et al. | |
| 6,582,973 B1 * | 6/2003 | Laaksonen et al. ............ | 438/5 |
| 6,593,232 B1 | 7/2003 | Huang et al. | |
| 2001/0034106 A1 * | 10/2001 | Moise et al. ................ | 438/396 |
| 2002/0012876 A1 * | 1/2002 | Angelopoulos et al. ... | 430/271.1 |
| 2002/0164546 A1 * | 11/2002 | Brown et al. ............... | 430/316 |
| 2002/0173163 A1 * | 11/2002 | Gutsche ...................... | 438/736 |
| 2003/0180559 A1 * | 9/2003 | Wayton et al. .............. | 428/480 |
| 2003/0224606 A1 | 12/2003 | Laaksonen et al. | |
| 2004/0023151 A1 * | 2/2004 | Takeda et al. ........... | 430/270.1 |
| 2004/0023475 A1 | 2/2004 | Bonser et al. | |
| 2004/0053504 A1 | 3/2004 | Wise et al. | |

OTHER PUBLICATIONS

Mahorowala et al.; Tunable Anti-Reflective Coatings with Built-in-Hard Mask Properties Facilitating Thin Resist process; Emerging Lithographic Technologies V; Elizabeth Dobisz, Editor; Proceedings of SPIE VI. 4343 (2001) copyright 2001 SPIE.*

(Continued)

*Primary Examiner*—Nadine G. Norton
*Assistant Examiner*—Patricia A. George
(74) *Attorney, Agent, or Firm*—Pillsbury Winthrop Shaw Pittman LLP

(57) ABSTRACT

A method and system is described for preparing a film stack, and forming a feature in the film stack using a plurality of dry etching processes. The feature formed in the film stack can include a gate structure having a critical dimension of approximately 25 nm or less. This critical dimension can be formed in the polysilicon layer using four mask layers.

28 Claims, 14 Drawing Sheets

OTHER PUBLICATIONS

Chemical Composition of TEOS; http://www.prism.princeton.edu/prism_cleanroom/MSDS.htm, no date available.*

K. Babich et al., "A Novel Graded Antireflective Coating with Built-In Hardmask Properties Enabling 65 nm and Below CMOS Device Patterning", IEEE International Electron Devices Meeting, pp. 28.5-1 through 28.5-4, (2003).

U.S. Appl. No. 10/644,958, filed Aug. 21, 2003, Fukiage.

* cited by examiner

| Step | Press. (mT) | Power(T/B) (W) | Gap (mm) | C$_4$F$_8$ SCCM | Cl$_2$ (SCCM) | HBr (SCCM) | O$_2$ (SCCM) | N$_2$ (SCCM) | CF$_4$ (SCCM) | SF$_6$ (SCCM) | Ar (SCCM) | He (SCCM) | B.He (C/E) (Torr) | Temp. T/B/W (C) | Time (sec) |
|---|---|---|---|---|---|---|---|---|---|---|---|---|---|---|---|
| Trim, 430 | 70 | 100/30 | 140 | | | | 30 | 30 | | 20 | | | 3/3 | 80/30/60 | 15 |
| CAP, 440 | 20 | 100/80 | 140 | | 50 | | | | 80 | 100 | | | 3/3 | < | 15 |
| TERA, 450 | 20 | 100/80 | 140 | | | | | | | | | | 3/3 | < | EPD |
| O/E, 450 | 60 | 500/30 | 140 | 4 | | | 1 | | | | | | 10/10 | < | 10 |
| Ashing, 450 | 200 | 300/30 | 140 | | | | 300 | | | | | | 10/10 | < | EPD + 20% |
| LTO, 460 | 80 | 500/150 | 140 | | | | 2 | | 100 | | 400 | | 10/25 | < | EPD + 20% |
| SiN, 470 | 200 | 500/150 | 140 | | | | | | 50 | | 150 | | 10/25 | < | EPD + 20% |
| BT, 480 | 10 | 350/150 | 80 | | | 350 | 14 | | | | | | 3/3 | 80/75/60 | 5 |
| ME1, 480 | 30 | 100/75 | 120 | | | 500 | 2 | | | | | | 3/3 | < | 58 |
| ME2, 480 | 60 | 150/50 | 120 | | | | | | | | | 500 | 10/10 | < | EPD |
| OE, 480 | 60 | 150/100 | 120 | | | 25 | | | | | | 25 | 10/10 | < | 25 |

FIG. 10

METHOD AND SYSTEM FOR ETCHING A FILM STACK

This application relates to, but does not rely for priority on, U.S. patent application Ser. No. 10/926,404, entitled "Method and System for Etching a Gate Stack," filed on even date herewith, the contents of which are incorporated herein by reference.

BACKGROUND OF THE INVENTION

1. Field of the Invention

The present invention relates to a method of etching a gate stack in the formation of semiconductor devices and, more particularly, to a method and system for etching multiple layers in a gate stack in order to prepare a structure of 25 nm in size or less.

2. Description of Related Art

In material processing methodologies, pattern etching includes the application of a patterned mask of radiation-sensitive material, such as photoresist, to a thin film on an upper surface of a substrate, and transferring the mask pattern to the underlying thin film by etching. The patterning of the radiation-sensitive material generally involves coating an upper surface of the substrate with a thin film of radiation-sensitive material and then exposing the thin film of radiation-sensitive material to a radiation source through a reticle (and associated optics) using, for example, a photo-lithography system. Then, a developing process is performed, during which the removal of the irradiated regions of the radiation-sensitive material occurs (as in the case of positive photoresist), or the removal of non-irradiated regions occurs (as in the case of negative resist) using a base developing solution, or solvent. The remaining radiation-sensitive material exposes the underlying substrate surface in a pattern that is ready to be etched into the surface. Photolithographic systems for performing the above-described material processing methodologies have become a mainstay of semiconductor device patterning for the last three decades, and are expected to continue in that role down to 65 nm resolution, and less.

The resolution ($r_o$) of a photolithographic system determines the minimum size of devices that can be made using the system. Having a given lithographic constant $k_1$, the resolution is given by the equation $$r_o = k_1 \lambda / NA, \qquad (1)$$

where $\lambda$ is the operational wavelength, and NA is the numerical aperture given by the equation $$NA = n \cdot \sin \theta_o. \qquad (2)$$

Angle $\theta_o$ is the angular semi-aperture of the system, and n is the index of refraction of the material filling the space between the system and the substrate to be patterned.

To print smaller and smaller structures, current lithographic trends involve increasing the numerical aperture (NA). However, although the increased NA permits greater resolution, the depth of focus for the images projected into the light-sensitive material is reduced, leading to thinner mask layers. As the light-sensitive layer thickness decreases, the patterned light-sensitive layer becomes less effective as a mask for pattern etching, i.e., most of the (light-sensitive) mask layer is consumed during etching. Without a dramatic improvement in etch selectivity, single layer masks have become deficient in providing the necessary lithographic and etch characteristics suitable for high resolution lithography.

An additional shortcoming of single layer masks is the control of critical dimension (CD). Substrate reflections at ultraviolet (UV) and deep ultraviolet (DUV) wavelengths are known to cause standing waves in the light-sensitive layer due to thin film interference. This interference manifests as periodic variations in light intensity in the light-sensitive layer during exposure, resulting in vertically spaced striations in the light-sensitive layer and loss of CD.

In order to counter the effects of standing waves in the light-sensitive layer as well as provide a thicker mask for subsequent pattern etch transfer, a bilayer or multilayer mask can be formed that incorporates a bottom anti-reflective coating (BARC). The BARC layer includes a thin absorbing film to reduce thin film interference; however, the BARC layer can still suffer from several limitations including poor thickness uniformity due in part to spin-on deposition techniques.

A hard mask may also be used to provide improved maintenance of critical dimensions. The hard mask may be a vapor deposited thin film provided under the light sensitive layer to provide better etch selectivity than the light sensitive layer alone. This etch selectivity of the hard mask material permits use of a thinner mask that allows greater resolution while also allowing a deeper etch process. The present inventors have recognized, however, that the use of conventional hard masks have limited etch selectivity and resilience to etch processes that will limit their use in future generation devices with even smaller structures.

SUMMARY OF THE INVENTION

One aspect of the present invention is to reduce or eliminate any or all of the above-described problems.

Another object of the present invention is to provide a method of forming a feature in a film stack having a critical dimension (CD) approximately equal to 25 nm, or less.

Yet another aspect of the present invention is to provide a method of etching a gate stack including a tunable etch resistant anti-reflective (TERA) coating.

According to yet another aspect, a method of preparing a feature on a substrate is described that includes forming a film stack on a substrate, the film stack comprising a polysilicon layer. A first mask layer is formed on the polysilicon layer, a second mask layer is formed on the first mask layer, a third mask layer is formed on the second mask layer, a fourth mask layer is formed on the third mask layer, and a layer of light-sensitive material is formed on the fourth mask layer. A pattern is formed having a first critical dimension in the layer of light sensitive material using lithography. The pattern is trimmed to form a second critical dimension in the pattern less than the first critical dimension. The pattern is transferred to the fourth mask layer, the third mask layer, the second mask layer, the first mask layer and the polysilicon layer, wherein a final critical dimension of approximately 25 nm or less is achieved.

Other aspects of the invention will become apparent from the description that follows and the drawings appended hereto. In addition, those skilled in the art will appreciate still further aspects of the invention, even if not specifically enumerated herein.

BRIEF DESCRIPTION OF THE DRAWINGS

In the accompanying drawings, which form a part of the description of embodiments of the invention, like reference numerals are used to refer to like structures, wherein:

FIG. 10 illustrates a process recipe table according to an example of the invention;

DETAILED DESCRIPTION OF EXEMPLARY EMBODIMENTS

As described above, the use of a hard mask has been adopted to complement the lithographic structure, and can be utilized in applications where the specifications for critical dimensions are stringent. One variety of hard masks can be broadly classified as having a structural formula R:C:H:X, wherein R is selected from the group including at least one of Si, Ge, B, Sn, Fe, Ti, and combinations thereof, and wherein X is not present or is selected from the group including one or more of O, N, S, and F. Such hard masks can be referred to as a tunable etch resistant anti-reflective (TERA) coating. These TERA coatings can be produced having a tunable index of refraction and extinction coefficient which can be optionally graded along the film thickness to match the optical properties of the substrate with the imaging light-sensitive layer. U.S. Pat. No. 6,316,167, assigned to International Business Machines Corporation, discussed one such example and is incorporated herein by reference in its entirety. As described in this patent, TERA films are used in lithographic structures for front end of line (FEOL) operations, such as gate formation, where control of the critical dimension is very important. In these applications, TERA coatings provide substantial improvement to the lithographic structure for forming gate devices at the 65 nm device node and smaller.

As noted above, in material processing methodologies, pattern etching utilizing such a lithographic structure generally includes the application of a thin layer of light-sensitive material, such as photoresist, to an upper surface of a substrate, that is subsequently patterned in order to provide a mask for transferring this pattern to the underlying hard mask during etching. The present inventors have discovered, however, that conventional hard mask films such as TERA coatings can be damaged during processing steps using conventional etch chemistries. For example, a $CHF_3$-based etch chemistry, such as $CHF_3/N_2$ or $CHF_3/N_2/O_2$, can lead to poor etch selectivity between the TERA coating and underlying layers, poor sidewall profile control, and excessive deposition. Additionally, for example, $Cl_2$-based etch chemistries, such as $Cl_2$, $Cl_2/CHF_3$, $Cl_2/O_2$, $Cl_2/C_4F_8$ or $Cl_2/CH_2F_2$, can lead to poor etch selectivity between the selectivity to photoresist as well as underlying layers, and profile undercutting. The present inventors have discovered that an alternative etch chemistry can lead to improved etch characteristics.

Figure 1A:
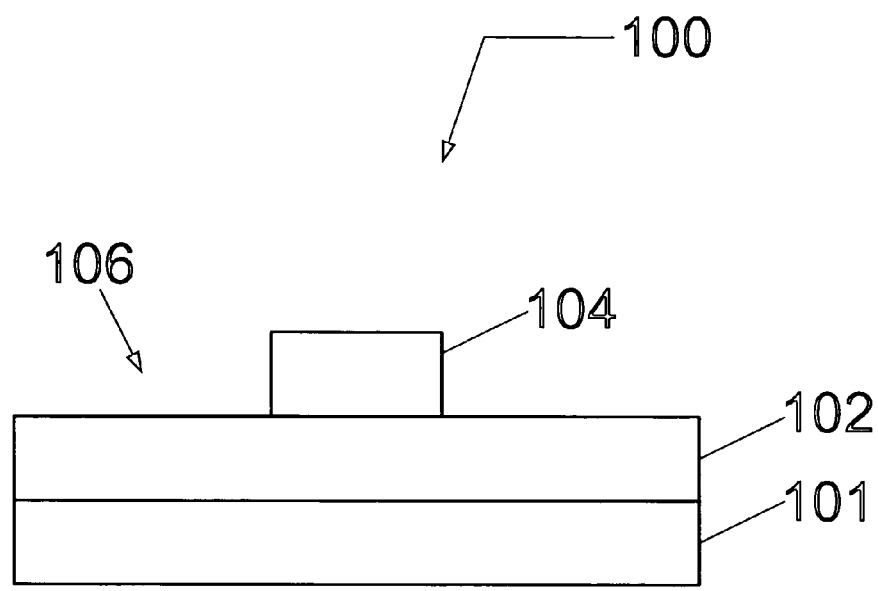
FIGS. 1A and 1B illustrate a film stack including a tunable etch resistant anti-reflective (TERA) coating.
Figure 1B:
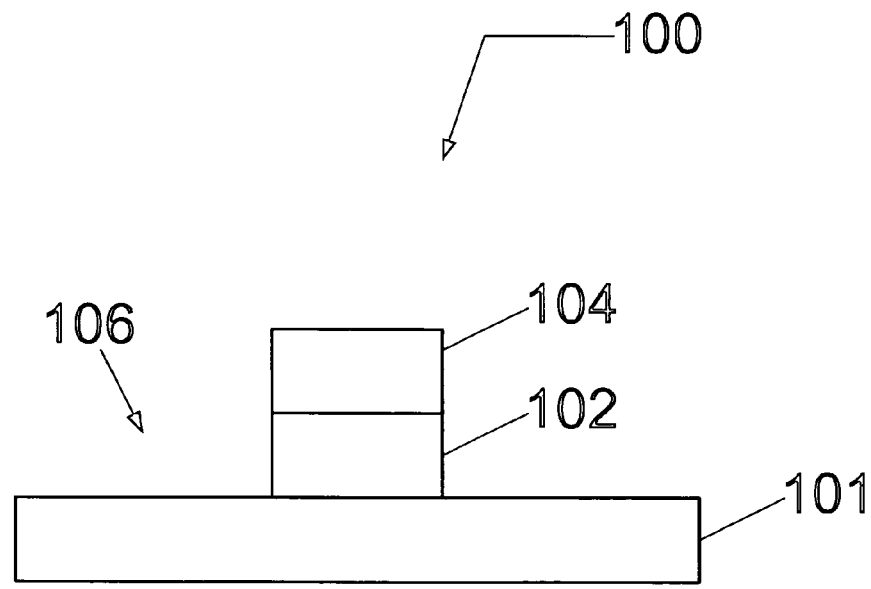

FIGS. 1A and 1B show a conventional etching process for a hard mask layer, such as a TERA coating, wherein the invention can be applied. As shown in FIG. 1A, a film stack 100 is formed having a substrate 101, a thin film 102, such as a TERA coating, formed on the substrate 101, and a layer of light-sensitive material 104 formed on the thin film 102. A pattern 106 can be formed in the layer of light-sensitive material 104 using conventional lithographic techniques. As seen in FIG. 1B, the pattern 106 in the light-sensitive layer 104 is transferred to the thin film 102 using an etch step.

In one embodiment of the invention, a process gas including $SF_6$ is introduced to a plasma processing system in order to form a fluorinated plasma. Thereafter, a substrate having a patterned layer of light-sensitive material, such as photoresist, is exposed to the plasma in order to transfer the pattern into an underlying TERA coating. The present inventors have discovered that etching the TERA coating using a $SF_6$-based etch chemistry improves the etch characteristics of the hard mask.

Figure 2:
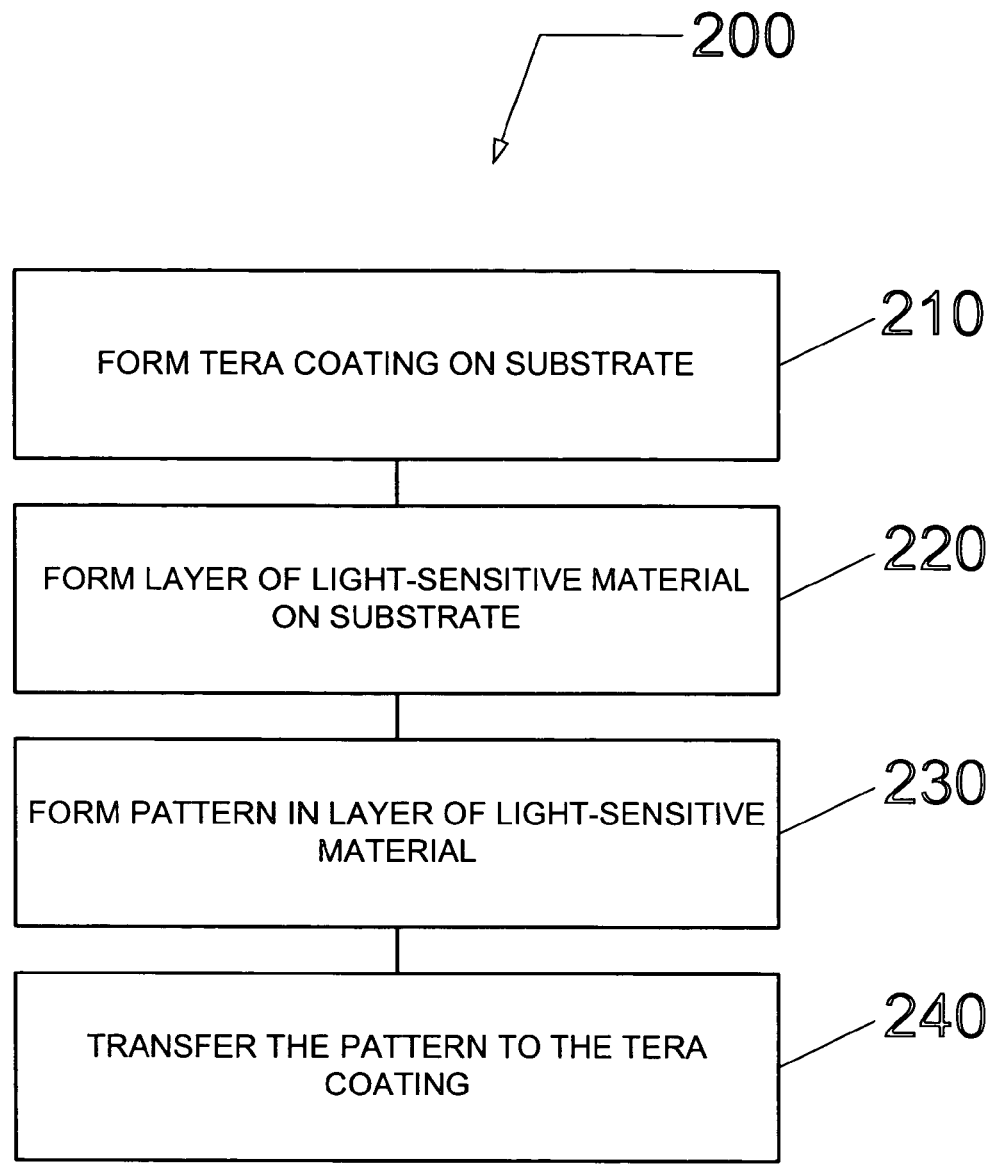
FIG. 2 shows a method for etching a TERA coating according to an embodiment of the invention.

In another embodiment, referring now to FIG. 2, a method of etching a TERA coating in a film stack is described. The method is illustrated as a flow chart 200 beginning in 210 with forming a TERA coating on a substrate as illustrated in FIGS. 1A and 1B. The TERA coating can be formed using vapor deposition techniques, such as chemical vapor deposition (CVD), or plasma enhanced chemical vapor deposition (PECVD).

The TERA coating includes a structural formula R:C:H:X, wherein R is selected from the group including at least one of Si, Ge, B, Sn, Fe, Ti, and combinations thereof, and wherein X is not present or is selected from the group including one or more of O, N, S, and F. The TERA coating can be fabricated to demonstrate an optical range for an index of refraction of approximately 1.40<n<2.60, and an extinction coefficient of approximately 0.01<k<0.78. Alternately, at least one of the index of refraction and the extinction coefficient can be graded (or varied) along a thickness of the TERA coating. Additional details are provided in U.S. Pat. No. 6,316,167, Furthermore, the TERA coating can be formed using PECVD, as described in greater detail in pending U.S. patent application Ser. No. 10/644,958, entitled "Method and apparatus for depositing materials with tunable optical properties and etching characteristics", filed on Aug. 21, 2003, the contents of which are incorporated herein by reference in their entirety. The optical properties of the TERA coating, such as the index of refraction, can be selected so as to substantially match the optical properties of the underlying layer or layers.

In 220, a layer of light-sensitive material is formed on the substrate. The layer of light-sensitive material can include a photoresist. For example, the layer (or layers) of light-sensitive material can be formed using a track system. The track system can be configured for processing 248 nm resists, 193 nm resists, 157 nm resists, EUV resists, (top/bottom) anti-reflective coatings (TARC/BARC), and top coats. For example, the track system can include a Clean Track ACT® 8, or Clean Track ACT® 12 resist coating and developing system commercially available from Tokyo Electron Limited (TEL). Other systems and methods for forming a photoresist film on a substrate are well known to those skilled in the art of spin-on resist technology.

Once the layer of light-sensitive material is formed on the substrate, it can be patterned with a pattern using micro-lithography in 230, followed by the removal of the irradiated regions of the light-sensitive material (as in the case of positive photoresist), or non-irradiated regions (as in the case of negative resist) using a developing solvent. The micro-lithography system can include any suitable conventional stepping lithographic system, or scanning lithographic system.

In 240, the pattern formed in the layer of light-sensitive material is transferred to the underlying TERA coating using a dry etch process. The dry etch process includes a $SF_6$-based etch chemistry. Alternately, the etch chemistry can further include an oxygen-containing gas, such as $O_2$, CO, or $CO_2$. Alternately, the etch chemistry can further include a nitrogen-containing gas, such as $N_2$ or $NH_3$. Alternately, the etch chemistry can further include an inert gas, such as a Noble gas (i.e., helium, neon, argon, xenon, krypton, radon). Alternately, the etch chemistry can further include another halogen-containing gas, such as $Cl_2$, HBr, $CHF_3$, or $CH_2F_2$. Alternately, the etch chemistry can further include a fluorocarbon gas, such as gas having the structure $C_xF_y$ (e.g., $CF_4$, $C_4F_8$, $C_4F_6$, $C_3F_6$, $C_5F_8$, etc.).

Figure 3A:
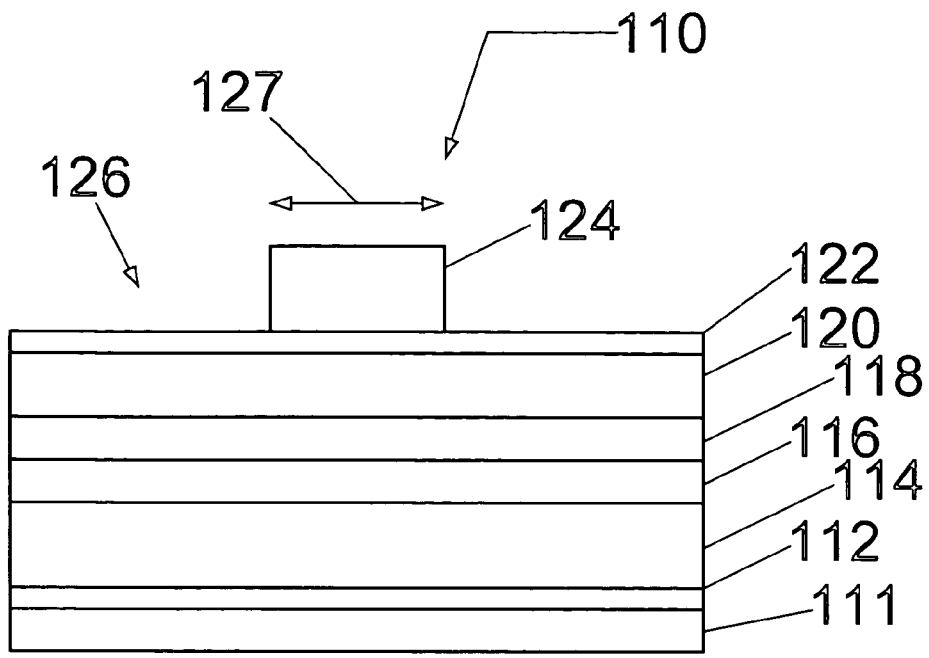
FIGS. 3A through 3E illustrate another film stack including a TERA coating.

Additionally, for example, the invention can be applied to a film stack 110, such as a gate stack, as shown in FIG. 3A. Therein, the film stack 110 is formed having a substrate 111, a gate oxide layer 112 (such as a silicon oxide layer, or high dielectric constant oxide layer), a gate polysilicon layer 114, a first mask layer 116, a second mask layer 118, a third mask layer 120, a fourth mask layer 122, and a layer of light sensitive material 124. For example, the first mask layer 116 can include a nitride layer, the second mask layer 118 can include an oxide layer, the third mask layer 120 can include a tunable etch resistant anti-reflective coating (TERA), and the fourth mask layer 122 can include a cap layer.

Referring still to FIG. 3A, the gate oxide layer 112 can include an oxide layer, such as $SiO_2$, or a high dielectric constant (high-k) oxide layer, such as $HfO_2$, or $ZrO_2$. This layer may be formed employing methods including but not limited to chemical vapor deposition (CVD) methods, plasma enhanced chemical vapor deposition (PECVD) methods and physical vapor deposition (PVD) sputtering methods. Additionally, the gate polysilicon layer 114 may be formed employing methods including but not limited to chemical vapor deposition (CVD) methods, plasma enhanced chemical vapor deposition (PECVD) methods and physical vapor deposition (PVD) sputtering methods.

The first mask layer 116 can include a nitride layer, such as silicon nitride ($Si_3N_4$). For example, the first mask layer 116 may include a 250 Angstrom (Å) thick layer of silicon nitride. This layer may be formed employing methods including but not limited to chemical vapor deposition (CVD) methods, plasma enhanced chemical vapor deposition (PECVD) methods and physical vapor deposition (PVD) sputtering methods.

The second mask layer 118 can include an oxide layer, such as thermal silicon dioxide (LTO). For example, the second mask layer 118 may include a 250 Angstrom (Å) thick layer of LTO. This layer may be formed employing methods including but not limited to chemical vapor deposition (CVD) methods, plasma enhanced chemical vapor deposition (PECVD) methods, physical vapor deposition (PVD) sputtering methods, and thermal oxidation.

The third mask layer 120 can include a TERA coating. The TERA coating includes a structural formula R:C:H:X, wherein R is selected from the group including one or more of Si, Ge, B, Sn, Fe, Ti, and combinations thereof, and wherein X is not present or is selected from the group including one or more of O, N, S, and F. For example, the TERA coating can include a 1000 Angstrom (Å) thick film comprising Si, C, and H, formed using plasma enhanced chemical vapor deposition (PECVD). This layer may be formed employing methods including but not limited to chemical vapor deposition (CVD) methods, plasma enhanced chemical vapor deposition (PECVD) methods, and physical vapor deposition (PVD) sputtering methods. Additional details are provided in U.S. Pat. No. 6,316,167. Furthermore, the TERA coating can be formed using PECVD, as described in greater detail in pending U.S. patent application Ser. No. 10/644,958.

The fourth mask layer 122 can include a cap layer, such as a film comprising Si, C, O, and H. For example, the fourth mask layer 122 may include a 250 Angstrom (Å) thick layer of SiCOH containing material. This layer may be formed employing methods including but not limited to chemical vapor deposition (CVD) methods, plasma enhanced chemical vapor deposition (PECVD) methods and physical vapor deposition (PVD) sputtering methods.

Additionally, the layer of light-sensitive material 124 can include photoresist, wherein a pattern can be formed therein using micro-lithography, followed by the removal of the irradiated regions of the light-sensitive material (as in the case of positive photoresist), or non-irradiated regions (as in the case of negative resist) using a developing solvent. For example, the layer (or layers) of light-sensitive material 124 can be formed using a track system. The track system can be configured for processing 248 nm resists, 193 nm resists, 157 nm resists, EUV resists, (top/bottom) anti-reflective coatings (TARC/BARC), and top coats. For example, the track system can comprise a Clean Track ACT 8, or ACT 12 resist coating and developing system commercially available from Tokyo Electron Limited (TEL). Other systems and methods for forming a photoresist film on a substrate are well known to those skilled in the art of spin-on resist technology. Additionally, for example, the mask pattern can be formed using any suitable conventional stepping lithographic system, or scanning lithographic system.

Figure 4:
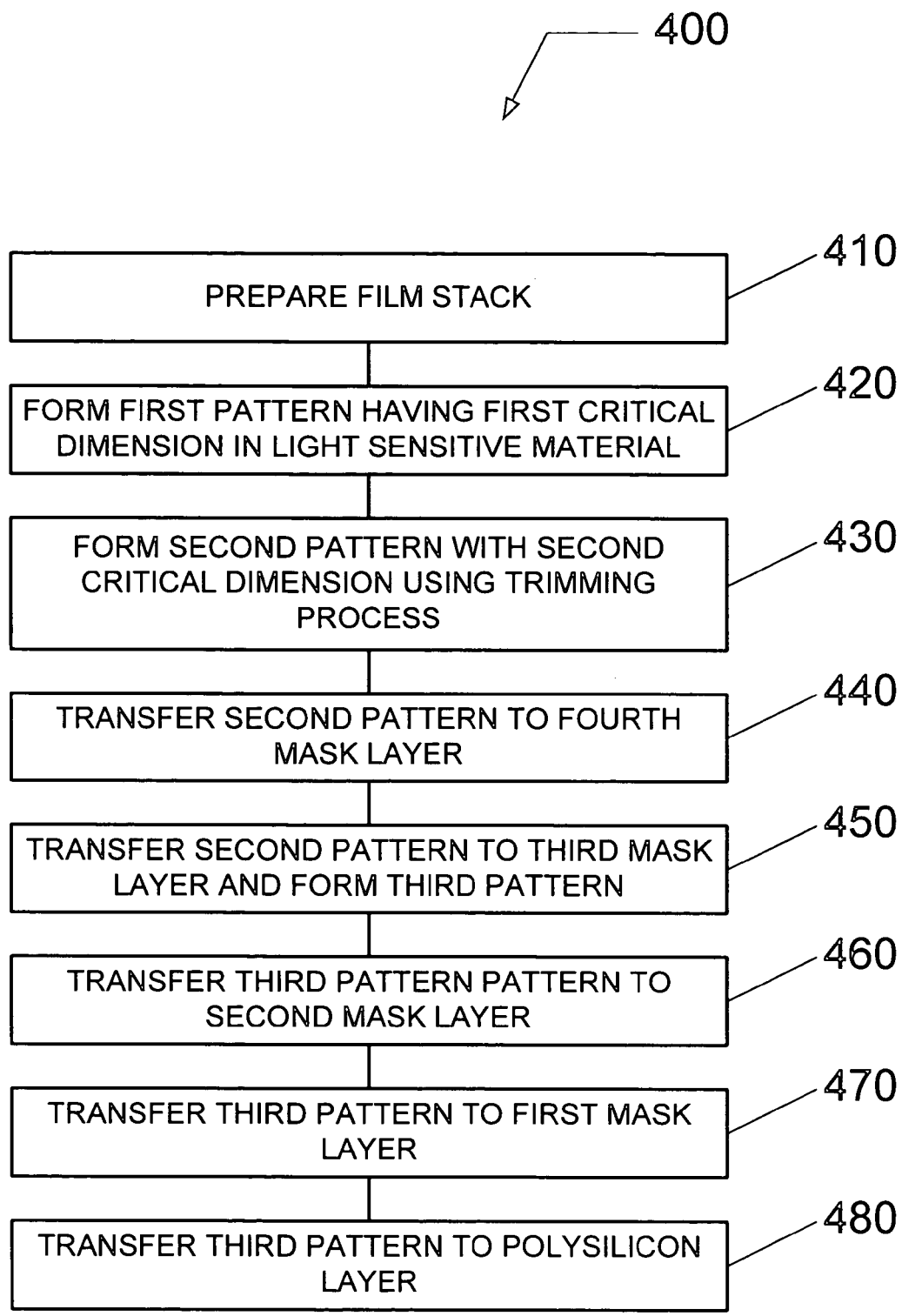
FIG. 4 shows a method for forming a feature in a film stack according to an embodiment of the invention.

In yet another embodiment, referring now to FIG. 4, a method of etching a film stack in order to achieve a critical dimension of approximately 25 nm and less is described. The method is illustrated as a flow chart 400 beginning in 410 with forming the film stack 110 shown in FIG. 3A. In 420, a pattern 126 is formed in the layer of light-sensitive material 124 using conventional lithographic techniques, whereby a first critical dimension 127 is achieved for a feature in the layer of light sensitive layer 124. The pattern 126 can, for example, be performed using 248 nm lithography.

Figure 3B:
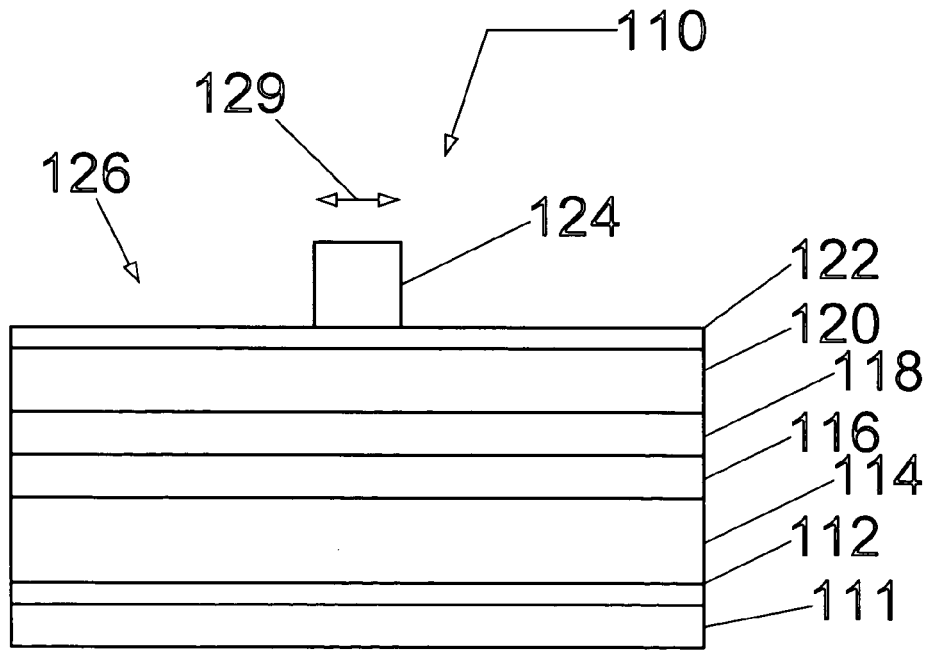

In 430, as shown in FIG. 3B, the feature in the layer of light sensitive material 124 is laterally trimmed to form a second critical dimension 129 in the pattern 126 for the feature. The trimming process can include a dry plasma etching process using an oxygen ($O_2$) and/or a nitrogen ($N_2$) based process chemistry.

Figure 3C:
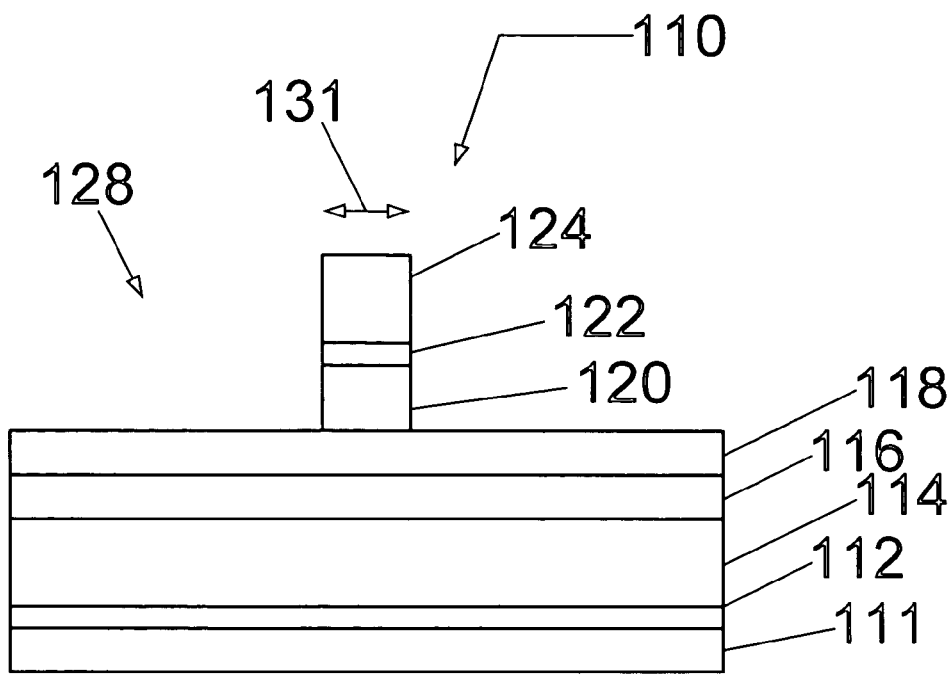

In 440, as shown in FIG. 3C, the second pattern 128 is transferred to the underlying fourth mask layer 122. The transfer process can include a dry plasma etching process using a $CF_4$ and $SF_6$ based process chemistry. Thereafter, in 450, the second pattern 128 is transferred to the underlying third mask layer 120. The transfer process can include a dry plasma etching process using an $SF_6$ based process chemistry.

Once the second pattern 128 is transferred to the third mask layer 120, an over-etch (O/E) process can be performed to complete the pattern transfer. The over-etch process can include a dry plasma etching process using a $Cl_2$ and/or an $O_2$ based process chemistry. During the over-etch process in 450, a third critical dimension 131 can be formed in the pattern, wherein the third critical dimension is less than or equal to the second critical dimension.

Following the over-etch process, the layer of light-sensitive material 124 can be removed in an ashing process. The ashing process can include a dry plasma etching process using an $O_2$ based process chemistry, for example.

Figure 3D:
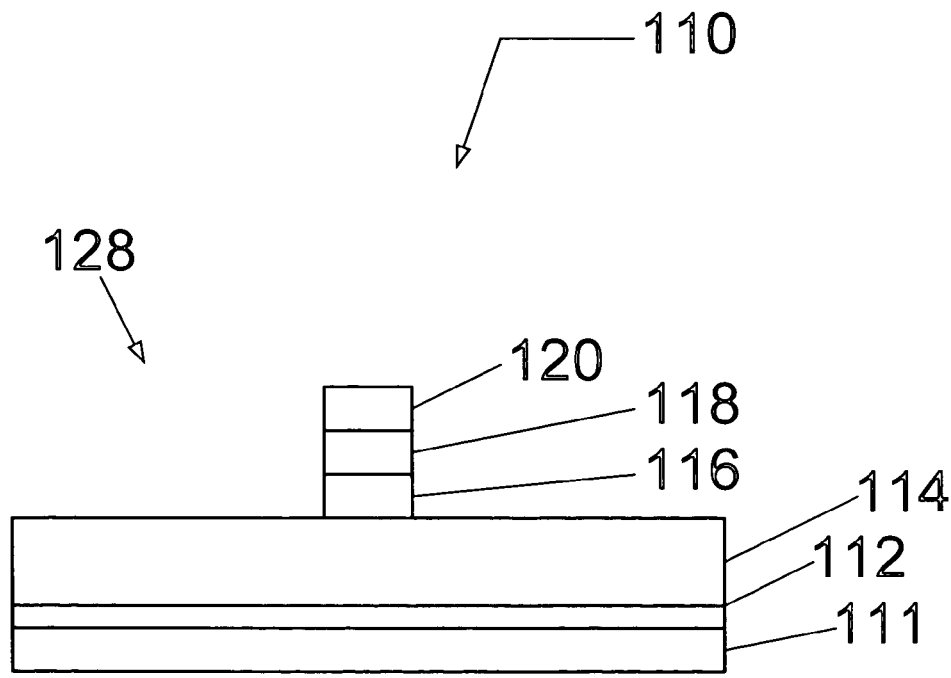

In 460, as shown in FIG. 3D, the third pattern 128 formed in the third mask layer 120 is transferred to the underlying second mask layer 118. The transfer process can include a dry plasma etching process using, in one possible embodiment, a $C_4F_8$ and $O_2$ based process chemistry with an inert gas, such as Ar. Thereafter, in 470, the third pattern 128 is transferred to the underlying first mask layer 116. The transfer process can include a dry plasma etching process using a $CF_4$ based process chemistry.

Figure 3E:
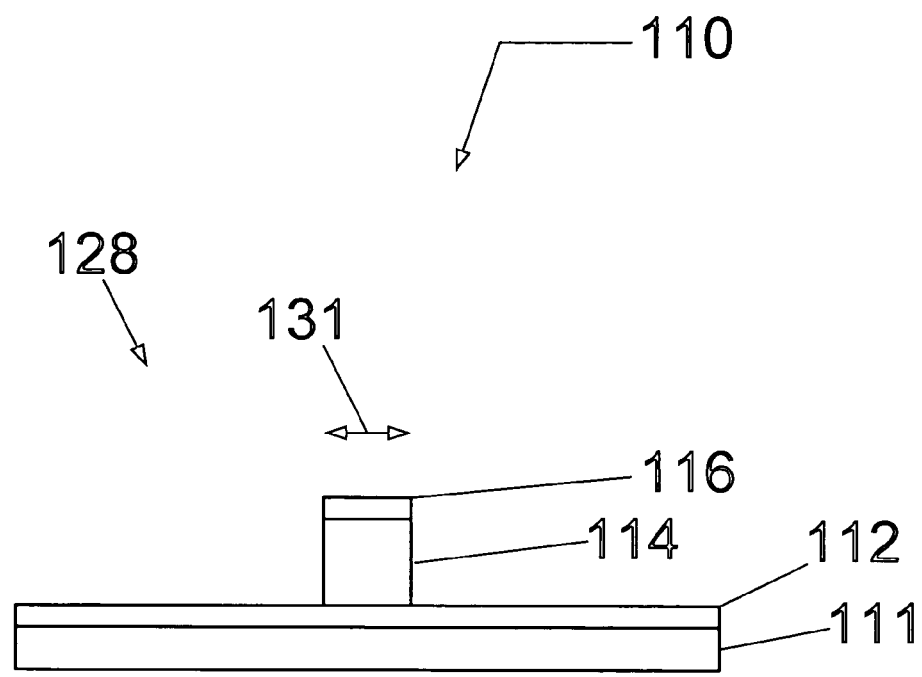

In 480, as shown in FIG. 3E, the third pattern 128 is transferred to the underlying polysilicon layer 114. The transfer process can include a dry plasma etching process using an HBr based process chemistry. The etching process can include one or more primary etch steps followed by an over-etch step. For example, the etching process can include a first process step (ME1—main etch 1) including an HBr process chemistry, followed by a second process step (ME2—main etch 2) including an HBr, $O_2$, and He process chemistry, followed by an over-etch process step including an HBr, $O_2$, and He process chemistry. However, in some cases, an oxide break-through (BT) step is required prior to initiating the polysilicon etch. For instance, once the polysilicon layer is exposed following the transfer process to the silicon nitride layer, exposure to oxygen can cause oxidation and the formation of a thin oxide layer. The break-through step can include a dry etching process using a $CF_4$ based process chemistry.

Figure 5:
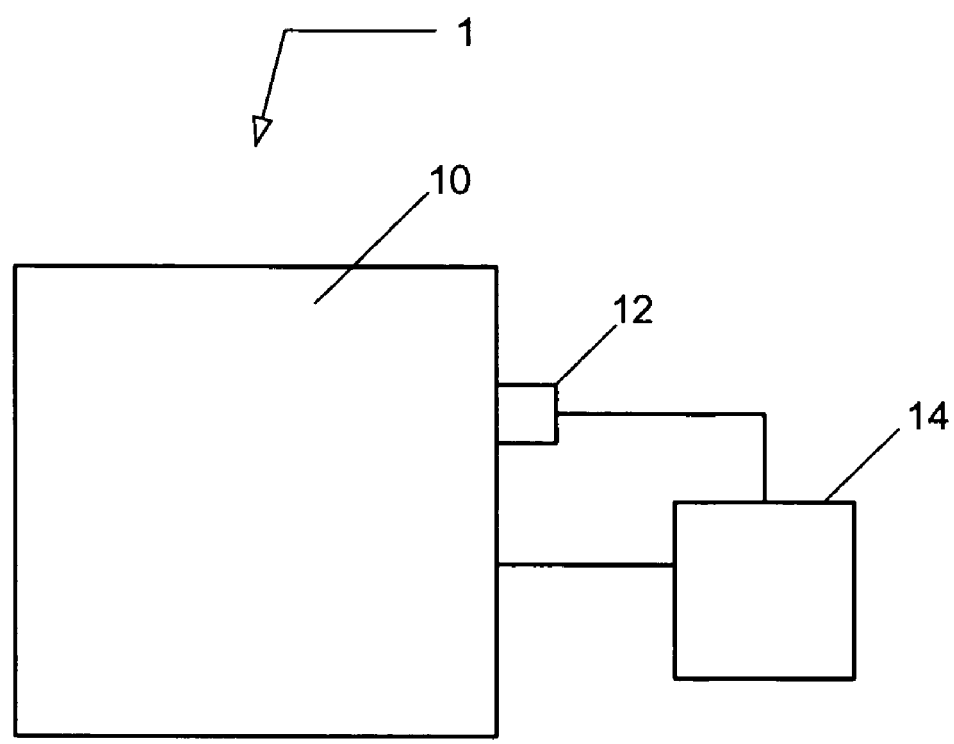
FIG. 5 shows a simplified schematic diagram of a plasma processing system according to an embodiment of the present invention.

The etching processes of the present invention can be performed in a plasma processing system. For example, FIG. 5 presents an exemplary plasma processing system 1 that may be used to implement the etch processes of the present invention. As seen in this Figure, the plasma processing system 1 includes a plasma processing chamber 10, a diagnostic system 12 coupled to the plasma processing chamber 10, and a controller 14 coupled to the diagnostic system 12 and the plasma processing chamber 10. The controller 14 is configured to execute a process recipe including an etching process. Additionally, the controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 5, utilizes a plasma for material processing. The plasma processing system 1 can include an etch chamber.

Figure 6:
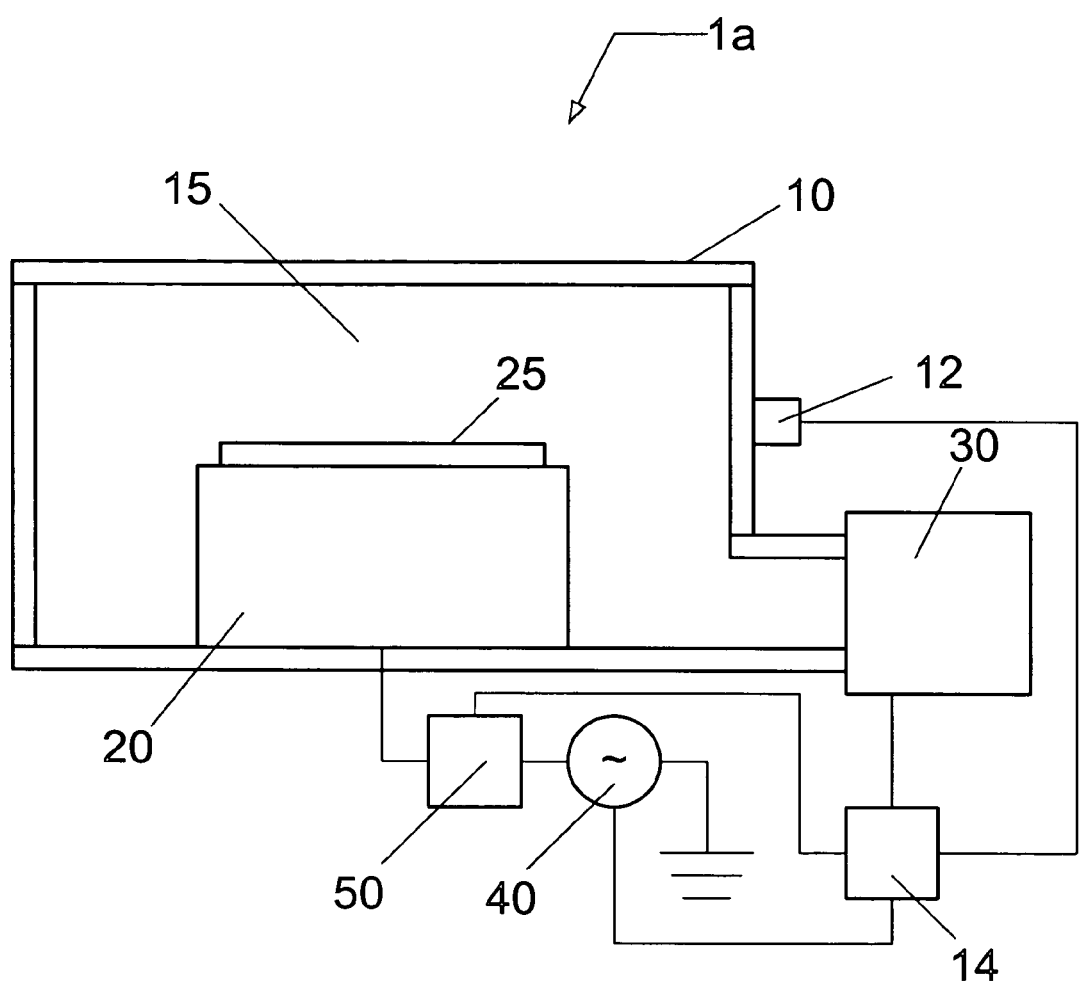
FIG. 6 shows a schematic diagram of a plasma processing system according to another embodiment of the present invention.

According to the embodiment depicted in FIG. 6, a plasma processing system 1a in accordance with the present invention can include the plasma processing chamber 10, substrate holder 20, upon which a substrate 25 to be processed is affixed, and vacuum pumping system 30. The substrate 25 can be, for example, a semiconductor substrate, a wafer or a liquid crystal display. The plasma processing chamber 10 can be, for example, configured to facilitate the generation of plasma in a processing region 15 adjacent to a surface of the substrate 25. An ionizable gas or mixture of gases is introduced via a gas injection system (such as a gas injection pipe, or gas injection showerhead) and the process pressure is adjusted. For example, a control mechanism (not shown) can be used to throttle the vacuum pumping system 30. Plasma can be utilized to create materials specific to a pre-determined materials process and/or to aid the removal of material from the exposed surfaces of the substrate 25. The plasma processing system 1a can be configured to process 200 mm substrates, 300 mm substrates, or larger.

The substrate 25 can be, for example, affixed to the substrate holder 20 via an electrostatic clamping system. Furthermore, the substrate holder 20 can, for example, further include a cooling system including a re-circulating coolant flow that receives heat from the substrate holder 20 and transfers heat to a heat exchanger system (not shown), or when heating, transfers heat from the heat exchanger system. Moreover, gas can, for example, be delivered to the back-side of the substrate 25 via a backside gas system to improve the gas-gap thermal conductance between the substrate 25 and the substrate holder 20. Such a system can be utilized when temperature control of the substrate 25 is required at elevated or reduced temperatures. For example, the backside gas system can include a two-zone gas distribution system, wherein the gas gap pressure (e.g., the helium gas gap pressure) can be independently varied between the center and the edge of the substrate 25. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

Figure 7:
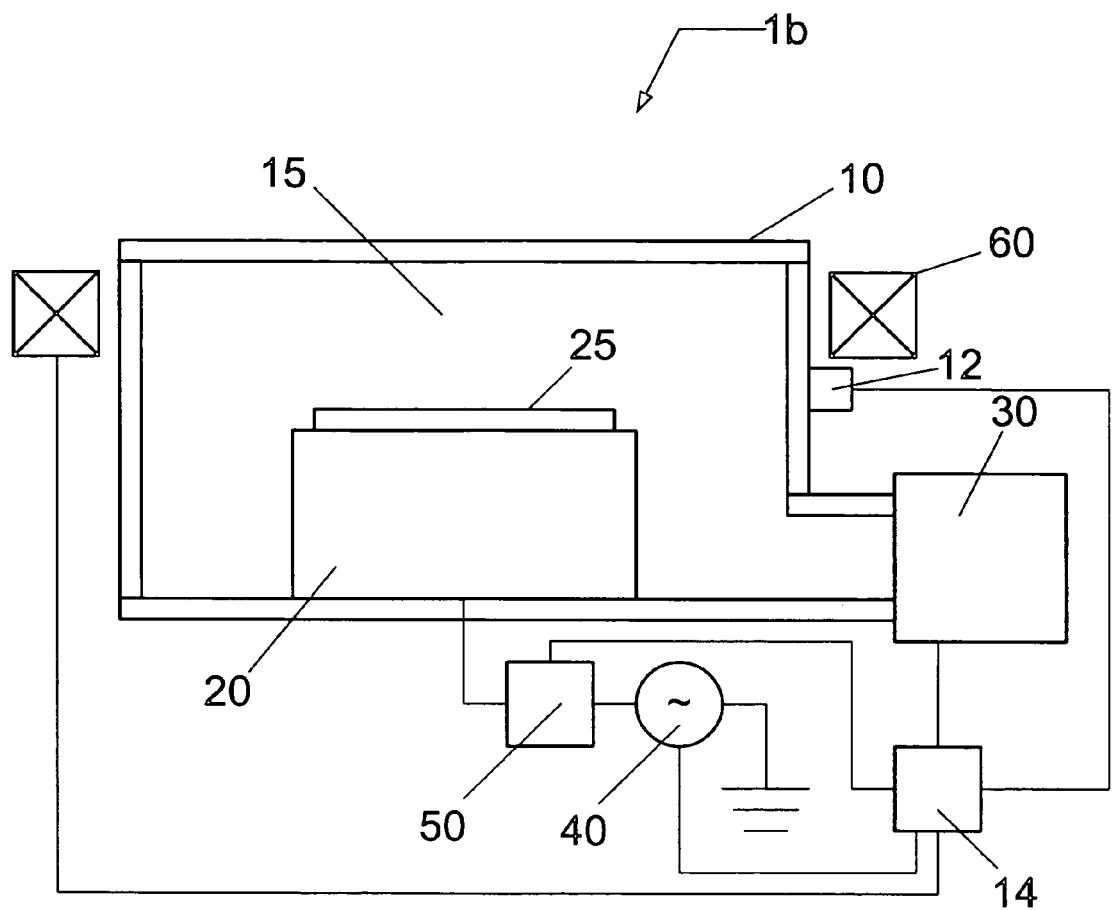
FIG. 7 shows a schematic diagram of a plasma processing system according to another embodiment of the present invention.

In the embodiment of the plasma processing system 1b shown in FIG. 7, the substrate holder 20 can include an electrode through which RF power is coupled to the processing plasma in the process space 15. For example, the substrate holder 20 can be electrically biased at a RF voltage via the transmission of RF power from a RF generator 40 through an impedance match network 50 to the substrate holder 20. The RF bias can serve to heat electrons to form and maintain a plasma. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Alternately, RF power can be applied to the substrate holder electrode at multiple frequencies. Furthermore, the impedance match network 50 serves to improve the transfer of RF power to plasma in the plasma processing chamber 10 by reducing the reflected power. Match network topologies (e.g., L-type, π-type, T-type, etc.) and automatic control methods are well known to those skilled in the art.

The vacuum pump system 30 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

The controller 14 includes a microprocessor, a memory, and a digital I/O port capable of generating control voltages sufficient to communicate and activate inputs to the plasma processing system 1b as well as monitor outputs from the plasma processing system 1b. Moreover, the controller 14 can be coupled to and can exchange information with the RF generator 40, the impedance match network 50, the gas injection system (not shown), the vacuum pump system 30, the diagnostic system 12, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of the plasma processing system 1b according to a process recipe in order to perform an etching process. One example of the controller 14 is a DELL PRECISION WORKSTATION 610™, available from Dell Corporation, Austin, Tex.

The controller 14 can be locally located relative to the plasma processing system 1b, or it can be remotely located relative to the plasma processing system 1b. For example, the controller 14 can exchange data with the plasma processing system 1b using at least one of a direct connection, an intranet, and the Internet. The controller 14 can be coupled to an intranet at, for example, a customer site (i.e., a device maker, etc.), or it can be coupled to an intranet at, for example, a vendor site (i.e., an equipment manufacturer). Additionally, for example, the controller 14 can be coupled to the Internet. Furthermore, another computer (i.e., controller, server, etc.) can, for example, access the controller 14 to exchange data via at least one of a direct connection, an intranet, and the Internet. Also, data may be transferred via a wired or a wireless connection, as would be appreciated by those skilled in the art.

The diagnostic system 12 can include an optical diagnostic subsystem (not shown). The optical diagnostic subsystem can include a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, the diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888, 337, the content of which is incorporated herein by reference in its entirety.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Furthermore, the diagnostic system 12 can include a system for performing optical digital profilometry, such as the system offered by Timbre Technologies, Inc. (2953 Bunker Hill Lane, Suite 301, Santa Clara, Calif. 95054).

In the embodiment shown in FIG. 7, a plasma processing system 1b that may be used to implement the present invention can, for example, be similar to the embodiment of FIG. 5 or FIG. 6 and can further include either a stationary, or mechanically or electrically rotating magnetic field system 60, in order to potentially increase plasma density and/or improve plasma processing uniformity, in addition to those components described with reference to FIG. 5 and FIG. 6. Moreover, the controller 14 can be coupled to the magnetic field system 60 in order to regulate the speed of rotation and field strength. The design and implementation of a rotating magnetic field is well known to those skilled in the art.

Figure 8:
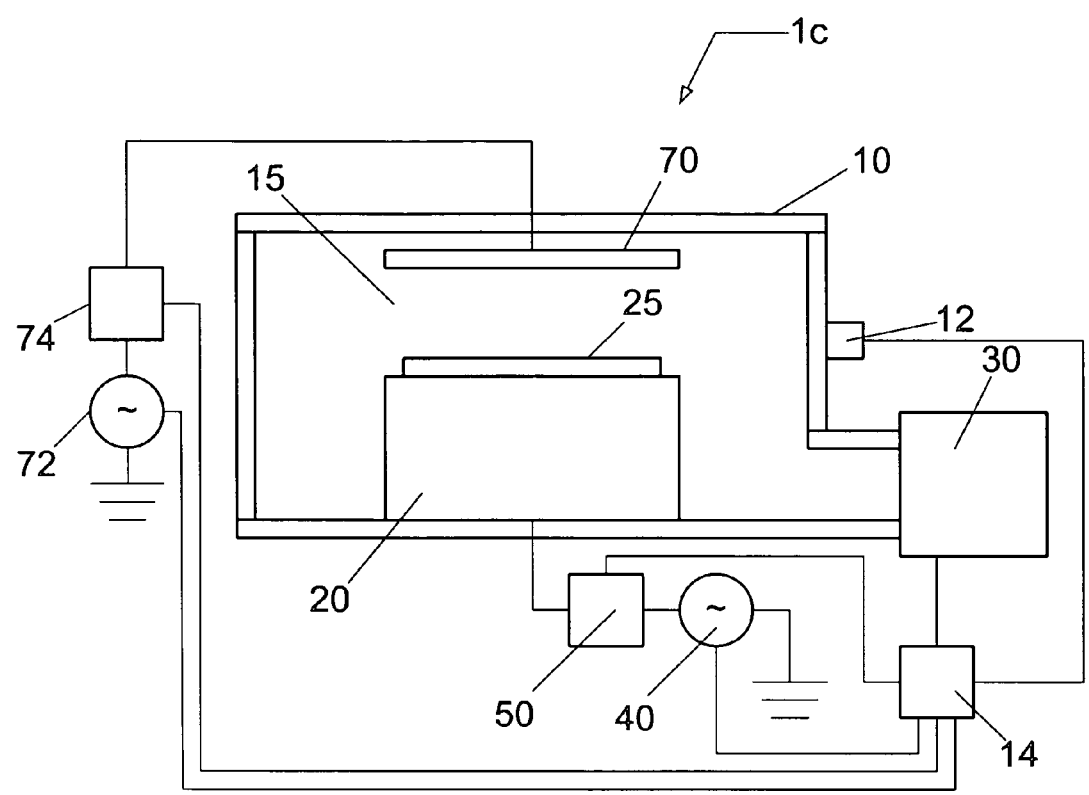
FIG. 8 shows a schematic diagram of a plasma processing system according to another embodiment of the present invention.

In the embodiment shown in FIG. 8, a plasma processing system 1c that may be used to implement the present invention can, for example, be similar to the embodiment of FIG. 5 or FIG. 6, and can further include an upper electrode 70 to which RF power can be coupled from an RF generator 72 through an impedance match network 74. A typical frequency for the application of RF power to the upper electrode 70 can range from 0.1 MHz to 200 MHz. Additionally, a typical frequency for the application of power to the lower electrode can range from 0.1 MHz to 100 MHz. Moreover, the controller 14 is coupled to the RF generator 72 and the impedance match network 74 in order to control the application of RF power to the upper electrode 70. The design and implementation of an upper electrode is well known to those skilled in the art.

Figure 9:
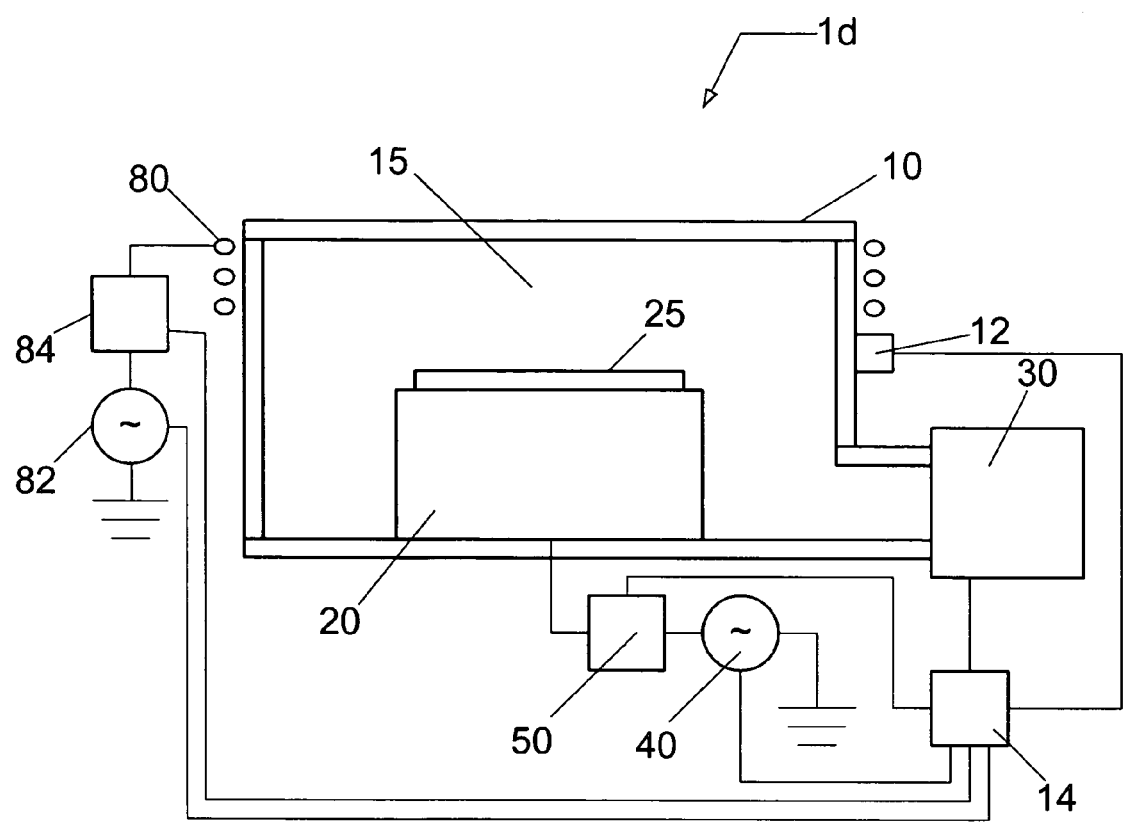
FIG. 9 shows a schematic diagram of a plasma processing system according to another embodiment of the present invention.

In the embodiment shown in FIG. 9, a plasma processing system 1d that may be used to implement the present invention can, for example, be similar to the embodiments of FIGS. 5 and 6, and can further include an inductive coil 80 to which RF power is coupled via an RF generator 82 through an impedance match network 84. RF power is inductively coupled from the inductive coil 80 through a dielectric window (not shown) to the plasma processing region 15. A typical frequency for the application of RF power to the inductive coil 80 can range from 10 MHz to 100 MHz. Similarly, a typical frequency for the application of power to the chuck electrode can range from 0.1 MHz to 100 MHz. In addition, a slotted Faraday shield (not shown) can be employed to reduce capacitive coupling between the inductive coil 80 and plasma. Moreover, the controller 14 is coupled to the RF generator 82 and the impedance match network 84 in order to control the application of power to the inductive coil 80. In an alternate embodiment, the inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma can be formed from the launching of a Helicon wave. In yet another embodiment, the plasma can be formed from a propagating surface wave. Each plasma source described above is well known to those skilled in the art.

In one example, a series of etch processes can be performed in a plasma processing system, such as the system described in FIG. 8, wherein the process parameter space can comprise a chamber pressure of about 5 to about 500 mTorr, a gap (i.e., spacing between an upper electrode and a lower electrode) ranging from 40 to 200 mm, an upper electrode (e.g., element 70 in FIG. 8) RF bias ranging from about 50 to about 1000 W, a lower electrode (e.g., element 20 in FIG. 8) RF bias ranging from about 10 to about 500 W, the upper electrode bias frequency can range from about 0.1 MHz to about 200 MHz, e.g., 60 MHz, and the lower electrode bias frequency can range from about 0.1 MHz to about 100 MHz, e.g., 2 MHz.

In another example, FIG. 10 presents a series of etch process conditions for achieving a final critical dimension in the polysilicon layer of approximately 25 nm, and less. As shown in FIG. 10, the process steps are related to the method described in FIG. 4. For each process step, the table presents the pressure in milli-Torr (mT), the RF power in Watts (W) to the upper electrode (T) and the lower electrode (B), the spacing between the upper electrode and the lower electrode in millimeters (mm), the flow rate of $C_4F_8$ in sccm (standard cubic centimeters per minute), the flow rate of $Cl_2$ in sccm, the flow rate of HBr in sccm; the flow rate in $O_2$ in sccm, the flow rate of $N_2$ in sccm, the flow rate of $CF_4$ in sccm, the flow rate of $SF_6$ in sccm, the flow rate of Ar in sccm, the flow rate of He in sccm, the pressure of backside He gas supplied to the center (C) of the substrate and the edge (E) of the substrate in Torr, the temperature of the upper electrode (T), the lower electrode (B), and the chamber wall (W) in degrees centigrade, and the process step time duration in seconds (where EPD represents endpoint detection, and the percentage represents the fraction of the time duration to EPD that the process time duration is extended).

Figure 11A:
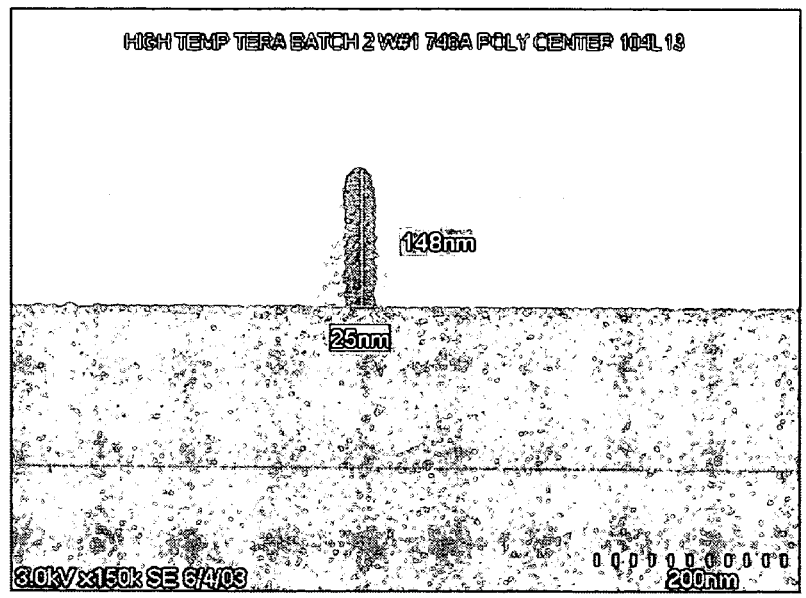
FIGS. 11A and 11B present scanning electron microscope (SEM) photographs of an isolated feature.
Figure 11B:
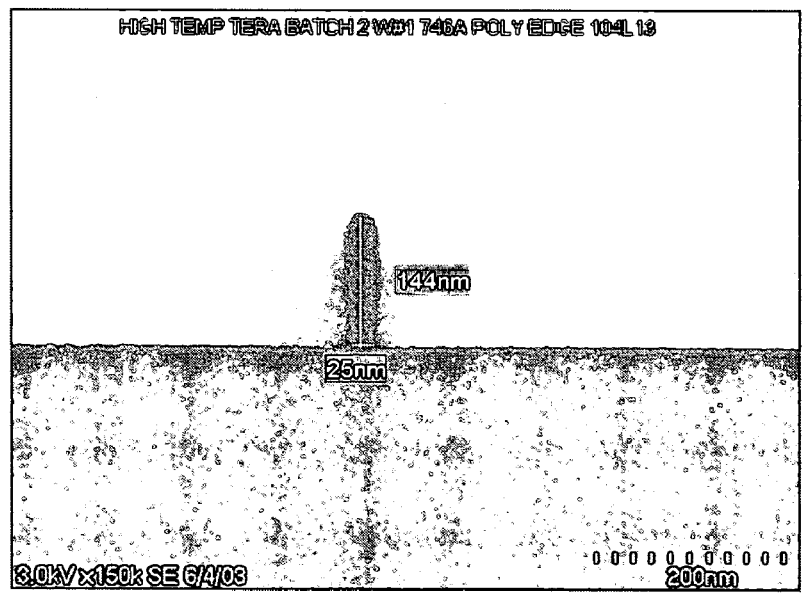
Figure 12A:
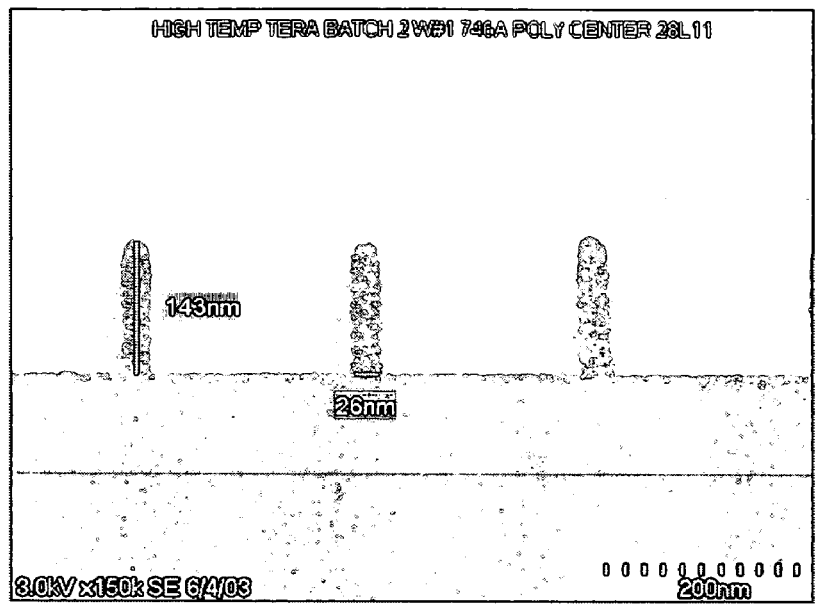
FIGS. 12A and 12B present SEM photographs of a nested feature.
Figure 12B:
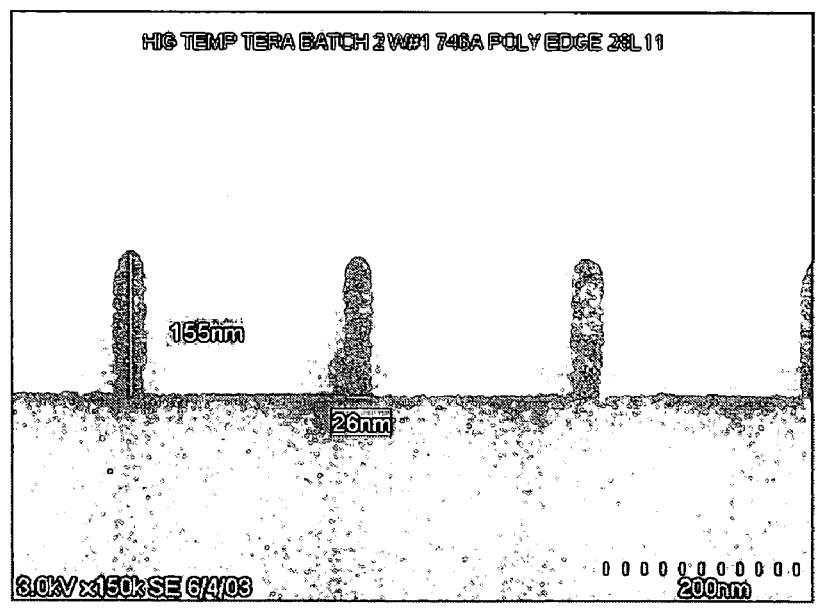

For instance, FIGS. 11A and 11B provide SEM (scanning electron microscope) photographs of an isolated polysilicon feature (with some silicon nitride remaining on top) having a bottom critical dimension of 25 nm and 25 nm at the center and edge of the substrate, respectively. Additionally, for instance, FIGS. 12A and 12B provide a SEM photographs of a nested polysilicon feature (with some silicon nitride remaining on top) having a bottom critical dimension of 26 nm and 26 nm at the center and edge of the substrate, respectively.

The data of FIGS. 11A and 11B, and FIGS. 12A and 12B are reported for both isolated features (i.e., broad spacing of features), and nested features (i.e., close spacing of features). The data demonstrates the success of the process in maintaining the critical dimension (CD), and achieving critical dimensions of approximately 25 nm.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of preparing a feature on a substrate comprising:

forming a film stack on a substrate, said film stack comprising a polysilicon layer, a first mask layer formed on said polysilicon layer, a second mask layer formed on said first mask layer, a third mask layer formed on said second mask layer, a fourth mask layer formed on said third mask layer, and a layer of light-sensitive material formed on said fourth mask layer;

forming a pattern having a first critical dimension in said layer of light sensitive material using lithography;

trimming said pattern to form a second critical dimension in said pattern less than said first critical dimension;

transferring said pattern to said fourth mask layer;

transferring said pattern to said third mask layer;

transferring said pattern to said second mask layer;

transferring said pattern to said first mask layer; and transferring said pattern to said polysilicon layer, wherein a final critical dimension of approximately 25 nm or less is achieved, wherein said pattern is transferred to said polysilicon layer via a main etch step preceded by a breakthrough process step, and wherein said breakthrough process step facilitates removal of oxidized silicon.

2. The method of claim 1, further comprising:

forming a third critical dimension in said third mask layer that is less than or equal to said second critical dimension.

3. The method of claim 1, wherein said fourth mask layer comprises Si, C, O, and H.

4. The method of claim 1, wherein said first mask layer comprises silicon nitride, said second mask layer comprises silicon oxide, said third mask layer comprises a tunable etch resistant anti-reflective (TERA) coating, and said fourth mask layer comprises Si, C, O, and H.

5. The method of claim 1, wherein said first critical dimension is formed using at least 248 nm lithography.

6. The method of claim 1, wherein said second critical dimension is formed via a dry etching process using at least one of an oxygen or a nitrogen based process chemistry.

7. The method of claim 1, wherein said pattern is transferred to said third mask layer via a dry plasma etching using a $SF_6$ based process chemistry.

8. The method of claim 1, wherein said pattern is transferred to said third mask layer via an over-etch process.

9. The method of claim 1, wherein said breakthrough process step comprises dry plasma etching comprising $CF_4$ and Ar.

10. The method of claim 1, wherein said main etch step comprises a dry plasma etching comprising HBr.

11. The method of wherein said main etch step comprises a first main etch step and a second main etch step, said first main etch step comprising dry plasma etching with HBr and said second main etch step comprising dry plasma etching with HBr, $O_2$, and an inert gas.

12. The method of claim 1, wherein said pattern is transferred to said polysilicon layer via an over-etch process step.

13. The method of claim 1, wherein said pattern is transferred to said fourth mask layer, said third mask layer, said second mask layer, said first mask layer, and said polysilicon layer via a plasma, whereby radio frequency (RF) power is coupled to a lower electrode configured to support said substrate and RF power is coupled to an upper electrode located opposite said lower electrode.

14. The method of claim 1, wherein said first mask layer comprises a nitride layer.

15. The method of claim 14, wherein said nitride layer comprises a silicon nitride layer.

16. The method of claim 1, wherein said second mask layer comprises an oxide layer.

17. The method of claim 16, wherein said oxide layer comprises a silicon oxide layer.

18. The method of claim 1, wherein said forming said third mask layer comprises forming a tunable etch resistant anti-reflective (TERA) coating on said substrate, said TERA coating comprising a structure defined by the formula R:C:H:X,
wherein R is comprising one or more of Si, Ge, B, Sn, Fe, or Ti, and wherein X, when present, is comprising one or more of O, N, S, or F.

19. The method of claim 18, wherein said TERA coating comprises Si, C, and H.

20. The method of claim 1, wherein said pattern is transferred to said fourth mask layer via a dry plasma etching using a fluorine based process chemistry.

21. The method of claim 20, wherein said fluorine based process chemistry comprises at least one of $CF_4$ and $SF_6$.

22. The method of claim 1, wherein said pattern is transferred to said first mask layer via a dry plasma etching using a $C_xF_y$ based process chemistry, where x and y represent integers greater than or equal to unity.

23. The method of claim 22, wherein said $C_xF_y$ based process chemistry comprises $CF_4$.

24. The method of claim 1, wherein said pattern is transferred to said second mask layer via a dry plasma etching using a $C_xF_y$ based process chemistry, where x and y represent integers greater than or equal to unity.

25. The method of claim 24, wherein said $C_xF_y$ based process chemistry comprises $C_4F_8$ and an inert gas.

26. The method of claim 25, wherein said $C_xF_y$ based process chemistry further comprises $O_2$.

27. A method of preparing a feature on a substrate comprising:
forming a film stack on a substrate, said film stack comprising a polysilicon layer, a first mask layer formed on said polysilicon layer, a second mask layer formed on said first mask layer, a third mask layer formed on said second mask layer, a fourth mask layer formed on said third mask layer, and a layer of light-sensitive material formed on said fourth mask layer;
forming a pattern having a first critical dimension in said layer of light sensitive material using lithography;
trimming said pattern to form a second critical dimension in said pattern less than said first critical dimension;
transferring said pattern to said fourth mask layer;
transferring said pattern to said third mask layer;
transferring said pattern to said second mask layer;
transferring said pattern to said first mask layer; and
transferring said pattern to said polysilicon layer;
wherein a final critical dimension of approximately 25 nm or less is achieved, and
wherein said pattern is transferred to said third mask layer via an ashing process for removing said layer of light sensitive material from said film stack.

28. A method of preparing a feature on a substrate comprising:
forming a film stack on a substrate, said film stack comprising a polysilicon layer, a first mask layer formed on said polysilicon layer, a second mask layer formed on said first mask layer, a third mask layer formed on said second mask layer, a fourth mask layer formed on said third mask layer, and a layer of light-sensitive material formed on said fourth mask layer;
forming a pattern having a first critical dimension in said layer of light sensitive material using lithography;
trimming said pattern to form a second critical dimension in said pattern less than said first critical dimension;
transferring said pattern to said fourth mask layer;
transferring said pattern to said third mask layer;
forming a third critical dimension in said third mask layer that is less than or equal to said second critical dimension;
transferring said pattern to said second mask layer;
transferring said pattern to said first mask layer; and
transferring said pattern to said polysilicon layer;
wherein a final critical dimension of approximately 25 nm or less is achieved,
wherein said forming said third mask layer comprises forming a tunable etch resistant anti-reflective (TERA) coating on said substrate, said TERA coating comprising a structure defined by the formula R:C;H:X,
wherein R is comprising one or more of Si, Ge, B, Sn, Fe, or Ti, wherein X, when present, is comprising one or more of O, N, S, or F, and
wherein said pattern is transferred to said third mask layer via a dry plasma etching using a $SF_6$ based process chemistry.

* * * * *